United States Patent
Hou et al.

(10) Patent No.: US 8,972,910 B1
(45) Date of Patent: Mar. 3, 2015

(54) ROUTING METHOD

(71) Applicant: Taiwan Semiconductor Manufacturing Company, Ltd., Hsinchu (TW)

(72) Inventors: Yuan-Te Hou, Hsinchu (TW); Wen-Hao Chen, Hsinchu (TW); Chin-Hsiung Hsu, Guanyin Township (TW); Meng-Kai Hsu, Xinfeng Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/967,913

(22) Filed: Aug. 15, 2013

(51) Int. Cl.
*G06F 17/50* (2006.01)
(52) U.S. Cl.
CPC ................... *G06F 17/5077* (2013.01)
USPC .............. 716/55; 716/50; 716/54; 716/56; 716/126; 430/5; 430/30
(58) Field of Classification Search
USPC ................. 716/50–56, 126; 430/5, 30
See application file for complete search history.

(56) References Cited

U.S. PATENT DOCUMENTS

| | | | | |
|---|---|---|---|---|
| 8,397,182 B2* | 3/2013 | Nagahara | ................. | 716/53 |
| 8,448,120 B2* | 5/2013 | Huang et al. | ................. | 716/126 |
| 8,612,912 B1* | 12/2013 | Chen et al. | ................. | 716/113 |
| 8,751,975 B2* | 6/2014 | Su et al. | ................. | 716/53 |
| 8,762,898 B1* | 6/2014 | Maziasz | ................. | 716/51 |
| 2009/0199137 A1* | 8/2009 | Huckabay et al. | ................. | 716/4 |
| 2011/0014786 A1* | 1/2011 | Sezginer et al. | ................. | 438/618 |
| 2011/0167397 A1* | 7/2011 | Huckabay et al. | ................. | 716/112 |
| 2012/0054696 A1* | 3/2012 | Su et al. | ................. | 716/55 |
| 2012/0317523 A1* | 12/2012 | Agarwal et al. | ................. | 716/52 |
| 2014/0173543 A1* | 6/2014 | Buck et al. | ................. | 716/115 |

* cited by examiner

*Primary Examiner* — Nha Nguyen
(74) *Attorney, Agent, or Firm* — Lowe Hauptman & Ham, LLP

(57) ABSTRACT

A method includes generating one or more routes usable for implementing a conductive path of an integrated circuit. A corresponding cost function value for the one or more routes is calculated according to a first cost function, including adjusting the corresponding cost function value based on whether the corresponding route is at least partially assigned to be formed in a conductive layer by a first patterning process or a second patterning process. The integrated circuit has electrical devices and the conductive layer, and the conductive layer has a first set of conductive lines formed by the first patterning process and a second set of conductive lines formed by the second patterning process. The first set of conductive lines has a unit resistance less than that of the second set of conductive lines. The conductive path electrically connects two of the electrical devices of the integrated circuit.

21 Claims, 4 Drawing Sheets

ROUTING METHOD

BACKGROUND

In the course of Integrated Circuit (IC) development, functional density (i.e., the number of interconnected electrical components per chip area) has generally increased while geometry size (i.e., the smallest component or line that can be created using a fabrication process) has decreased. This scaling down process has been made possible by the development of multiple-exposure or multiple-patterning technologies for even finer spatial resolution of a layer. Meanwhile, this scaling down process has also been made possible by the development of Electronic Design Automation (EDA) tools, such as automated placing electrical components and routing corresponding conductive lines, to assist circuit engineers handling the increased complexity of ICs.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1A:
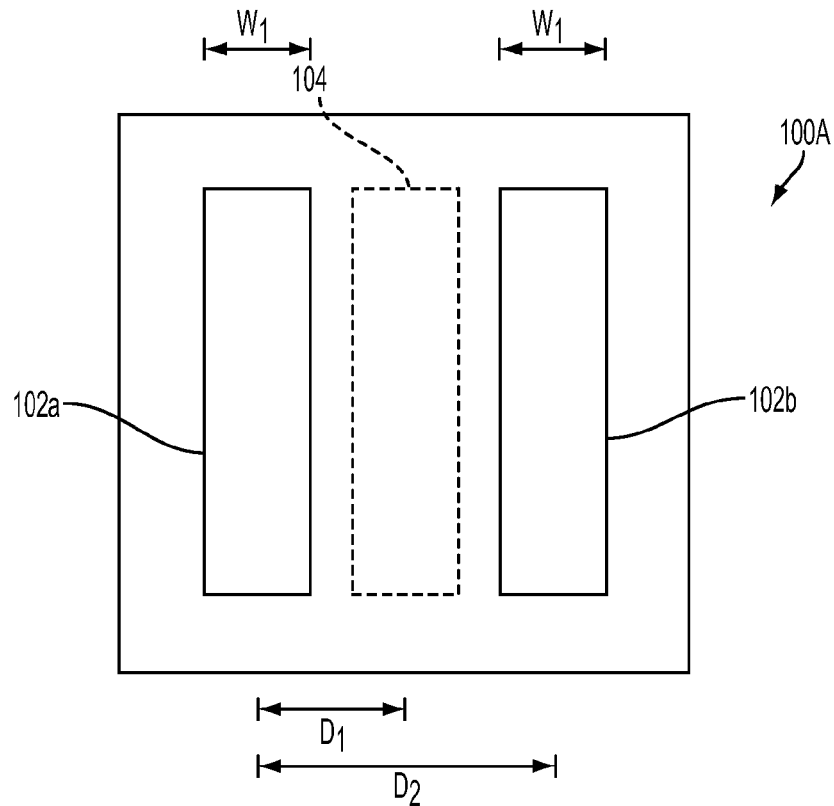
FIG. 1A is a two-dimensional diagram of a mask for fabricating a layer of features of an integrated circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

During integrated circuit fabrication, a single layer of features is sometimes formed by using multiple-exposure or multiple-patterning technologies to improve a spatial resolution of the layer. For example, a layer of conductive lines include a first set of conductive lines fabricated by a first patterning process and a second set of conductive lines fabricated by a second patterning process different from the first patterning process. In some embodiments, although the electrical characteristics, such as unit resistance or unit capacitance along a line length direction, of the first and second sets of conductive lines are designed to be identical, the first and second sets of conductive lines would usually have slightly different electrical characteristics as a result of process bias, e.g., caused by the first and second patterning processes.

In some embodiments, when the first set of conductive lines tends to have less unit resistance, the second set of conductive lines tends to have less unit capacitance, or vice versa. In some embodiments, an EDA tool, such as a place-and-route tool, is capable of generating routes for conductive paths based on the process bias corresponding to a fabrication process. In some embodiments, when routing conductive lines for an integrated circuit, an EDA tool is capable of routing a resistance-dominated conductive path using conductive lines having less unit resistance and routing a capacitance-dominated conductive path using conductive lines having less unit capacitance.

FIG. 1A is a two-dimensional diagram of a mask 100A for fabricating a layer of features of an integrated circuit in accordance with one or more embodiments. For example, this layer of features is a layer of conductive lines fabricated using a double patterning technology also being referred to as "spacer double patterning." Mask 100A includes layout patterns 102a and 102b for patterning a first set of conductive lines (such as conductive lines 112a and 112b in FIG. 1B). On mask 100A, layout pattern 102a and 102b have a predetermined width W1. The dotted pattern 104 refers to a to-be-formed conductive line (such as conductive line 114 in FIG. 1B) between conductive lines 112a and 112b (FIG. 1B) represented by layout patterns 102a and 102b (FIG. 1A).

The resulting conductive lines represented by layout pattern 102a and dotted pattern 104 has a first pitch D1, and the resulting conductive lines represented by layout pattern 102a and layout pattern 102b have a second pitch D2. Because the first pitch D1 is less than a predetermined threshold distance of a predetermined fabrication process, conductive lines represented by layout pattern 102a and dotted pattern 104 cannot be fabricated using the same mask 100A. Because the second pitch D2 is greater than the predetermined threshold distance, conductive lines represented by layout pattern 102a and layout pattern 102b are fabricated using the same mask 100A. As such, the dotted pattern 104 is not on the mask 100A.

Figure 1B:
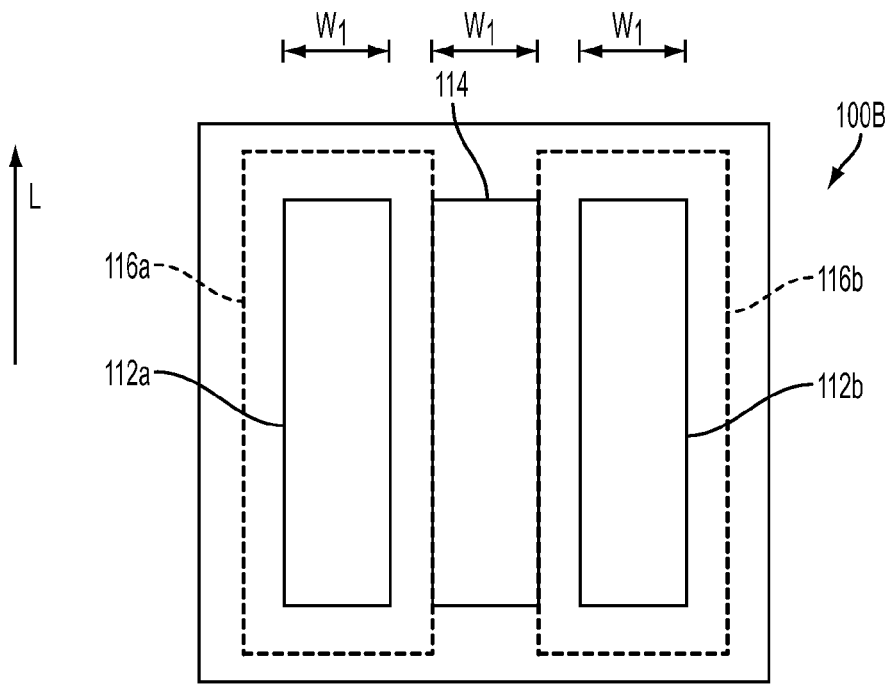
FIG. 1B is a top view of a resulting structure fabricated according to the mask of FIG. 1A without any process bias in accordance with one or more embodiments.

FIG. 1B is a top view of a resulting structure 100B fabricated according to the mask 100A of FIG. 1A without any process bias in accordance with one or more embodiments. For example, conductive lines 112a, 112b, and 114 of structure 100B are fabricated using "spacer double patterning" technology using mask 100A of FIG. 1. Conductive lines 112a and 112b are fabricated by a first patterning process layout according to patterns 102a and 102b of mask 100A. Then, conductive line 114 is formed by a second patterning process, including forming spacer structures 116a and 116b (depicted by dotted lines) surrounding conductive lines 112a and 112b and then forming conductive line 114 within a gap between spacer structures 116a and 116b. In some embodiments, another mask different from mask 100A is used to remove excessive conductive materials filling the gap between spacer structures 116a and 116b but are not planned to be part of conductive line 114. After the formation of conductive lines 112a, 112b, and 114, spacer structures 116a and 116b are removed.

For example, conductive lines 112a and 112b and conductive line 114 are planned to have the same width W1. In an ideal scenario, the first patterning process for forming conductive lines 112a and 112b and the second patterning process for forming conductive line 114 do not cause any process bias between conductive lines 112a and 112b and conductive line 114.

Also, for signals travelling along a line length direction L, unit capacitance and unit resistance of a conductive line vary with a width of the conductive line. Therefore, ideally unit capacitance and unit resistance of a first set of conductive lines formed by the first patterning process are the same as unit capacitance and unit resistance of a second set of conductive lines formed by the second patterning process.

However, because the first and second patterning processes include various steps utilizing various machines and chemicals with different settings, the first and second patterning processes are usually configured to maximize production yield and/or performance of the resulting integrated circuit instead of matching electrical characteristics of the first and second sets of conductive lines. Once the setting of the corresponding fabrication process is determined, modeling of the process bias caused by the first and second patterning processes is also made available to the EDA tool. In some embodiments, one of many observable influences of the process bias is to cause one of the first and second sets of conductive lines to have less unit resistance and the other to have less unit capacitance.

Figure 1C:
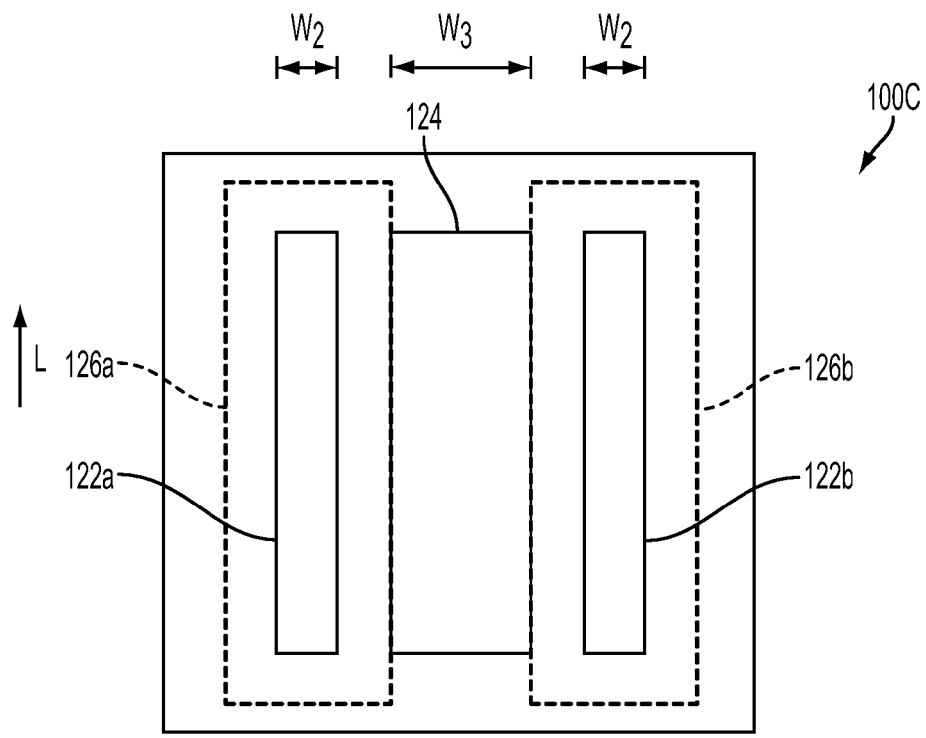
FIG. 1C is a top view of a resulting structure fabricated according to the mask of FIG. 1A under a first type of process bias in accordance with one or more embodiments.

FIG. 1C is a top view of a resulting structure 100C fabricated according to the mask 100A of FIG. 1A under a first type of process bias in accordance with one or more embodiments. Resulting structure 100C includes conductive lines 122a, 122b, and 124. Conductive lines 122a and 122b of structure 100C are fabricated according to the first patterning process and the layout patterns 102a and 102b of mask 100A in a manner similar to the fabrication of conductive lines 112a and 112b of FIG. 1B. Conductive line 124 is fabricated according to conductive lines 122a and 122b and spacer structures (represented by the dotted lines) 126a and 126b in a manner similar to the fabrication of conductive line 114 of FIG. 1B. As a result of the first process bias, conductive lines 122a and 122b have a width W2, conductive line 124 has a width W3, and width W2 is less than width W3.

Therefore, for signals travelling along line length direction L, unit capacitance of the first set of conductive lines, such as conductive lines 122a and 122b, formed by the first patterning process is less than unit capacitance of the second set of conductive lines, such as conductive line 124, formed by the second patterning process. Also, for signals travelling along line length direction L, unit resistance of the first set of conductive lines, such as conductive lines 122a and 122b, formed by the first patterning process is greater than unit resistance of the second set of conductive lines, such as conductive line 124, formed by the second patterning process.

Figure 1D:
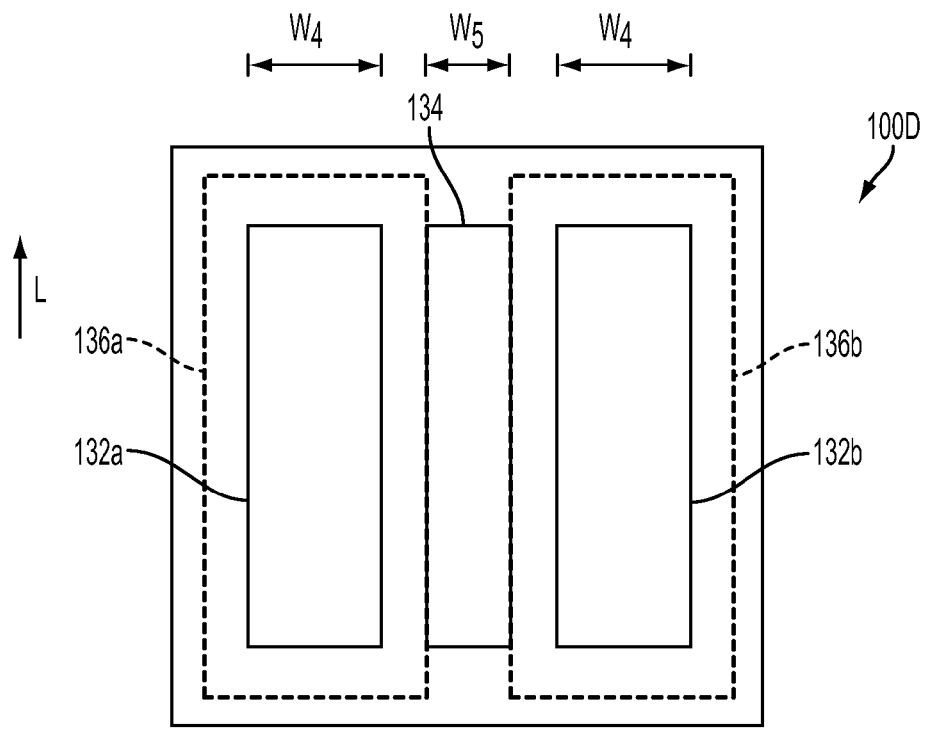
FIG. 1D is a top view of a resulting structure fabricated according to the mask of FIG. 1A under a second type of process bias in accordance with one or more embodiments.

FIG. 1D is a top view of a resulting structure 100D fabricated according to the mask 100A of FIG. 1A under a second type of process bias in accordance with one or more embodiments. Resulting structure 100D includes conductive lines 132a, 132b, and 134. Conductive lines 132a and 132b are fabricated according to the first patterning process and the layout patterns 102a and 102b of mask 100A in a manner similar to the fabrication of conductive lines 112a and 112b of FIG. 1B. Conductive line 134 is fabricated according to conductive lines 132a and 132b and spacer structures (represented by the dotted lines) 136a and 136b in a manner similar to the fabrication of conductive line 114 of FIG. 1B. As a result of the second process bias, conductive lines 132a and 132b have a width W4, conductive line 134 has a width W5, and width W4 is greater than width W5.

Therefore, for signals travelling along line length direction L, unit resistance of the first set of conductive lines, such as conductive lines 132a and 132b, formed by the first patterning process is less than unit capacitance of the second set of conductive lines, such as conductive line 134, formed by the second patterning process. Also, for signals travelling along length direction L, unit capacitance of the first set of conductive lines, such as conductive lines 132a and 132b, formed by the first patterning process is greater than unit capacitance of the second set of conductive lines, such as conductive line 134, formed by the second patterning process.

FIGS. 1A-1D are used to illustrate how process biases affect unit resistance and unit capacitance of conductive lines fabricated using "spacer double patterning" technology. Similar influences to electrical characteristics of conductive lines exist in other multiple-patterning or multiple-exposure processes. In some embodiments, for a layer of conductive lines, the EDA tool is made aware of which set of conductive lines tends to have greater unit resistance and which set of conductive lines tends to have greater unit capacitance.

Figure 2:
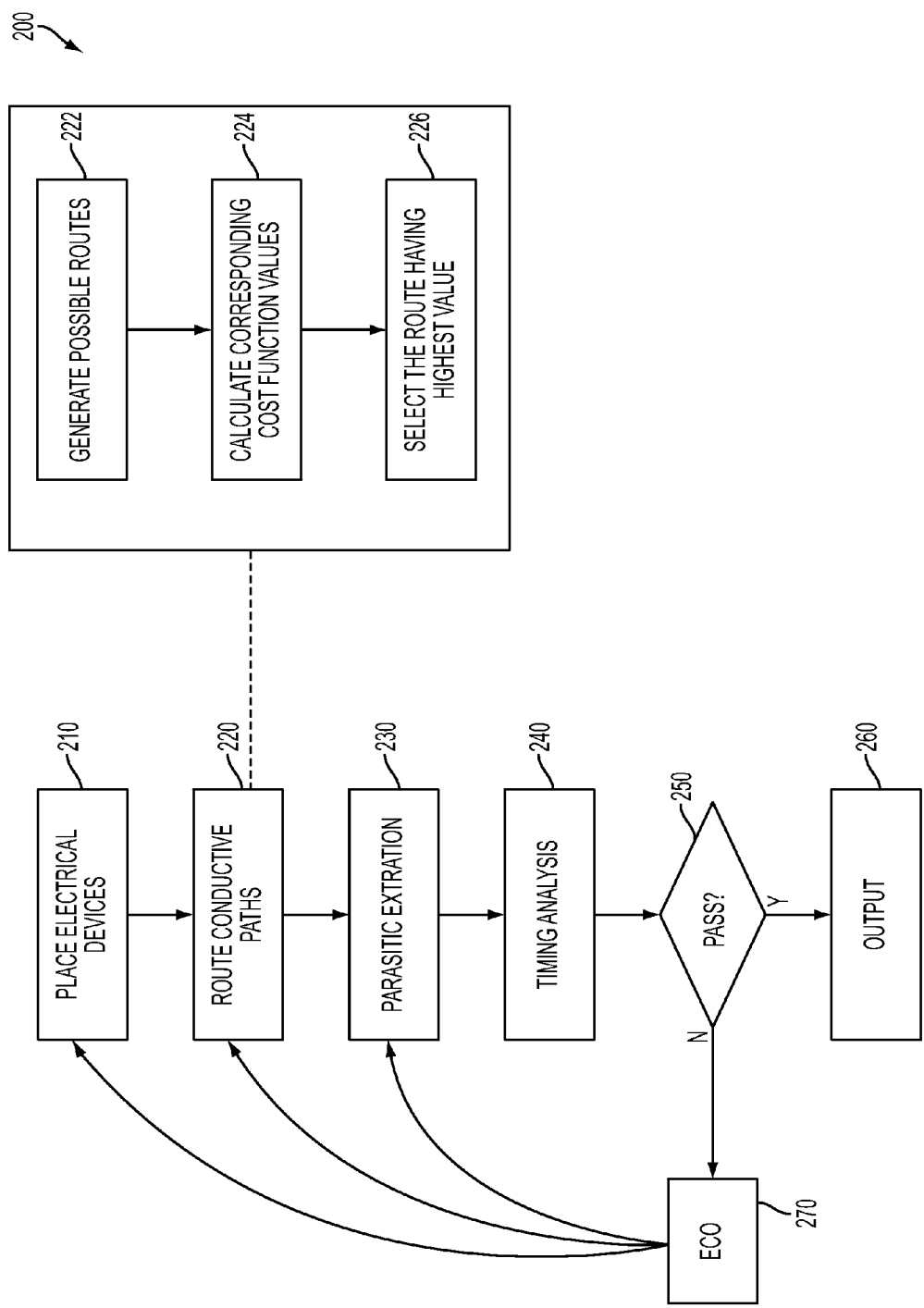
FIG. 2 is a flowchart of a method of designing an integrated circuit in accordance with one or more embodiments.

FIG. 2 is a flowchart of a method 200 of designing an integrated circuit in accordance with one or more embodiments. It is understood that additional operations may be performed before, during, and/or after the method 200 depicted in FIG. 2, and that some other processes may only be briefly described herein.

In operation 210, placement of electrical devices for an integrated circuit is performed. During operation 210, layout patterns for electrical devices that are on an integrated circuit design (such as circuit design 314a in FIG. 3) for forming the integrated circuit are loaded and placed on a predetermined layout space. Example electrical devices include transistors, resistors, and/or capacitors, which are to be formed on a substrate. In some embodiments, the layout patterns for the electrical devices have been prepared and verified to be suitable for fabrication using a predetermined fabrication process and are stored in a cell library (such as cell library 314b in FIG. 3). In some embodiments, various input and output ports of the electrical devices are identified to be electrically connected by conductive lines to be formed in one or more interconnection layers over the substrate.

In operation 220, routing of conductive lines to be formed in one or more interconnection layers for the integrated circuit is performed. During operation 220, conductive paths connecting the input and output ports of the electrical devices are identified and converted into sets of chains of conductive lines among the one or more interconnection layers. In some embodiments, at least one conductive layer of the conductive layers is fabricated using a multiple exposure or multiple-patterning technology. Therefore, the at least one conductive layer has a first set of conductive lines formed by a first patterning process and a second set of conductive lines formed by a second patterning process.

In some embodiments, it is made aware to the EDA tool that the first set of conductive lines has a unit resistance less than that of the second set of conductive lines, or vice versa. In some embodiments, it is also known to the circuit designing system that the first set of conductive lines has a unit capacitance greater than that of the second set of conductive lines, or vice versa.

Operation 220 includes performing operations 222, 224, and 226. In operation 222, for implementing a conductive path of the integrated circuit connecting two electrical devices placed during operation 210, one or more combinations of conductive lines of various conductive layers (also referred to as "routes") are generated. In operation 224, a corresponding cost function value for the one or more routes is calculated according to a cost function. In operation 226, one of the one or more routes having a best cost function value among the one or more routes is selected to be the route of the conductive path for further processing. In some embodiments, the best cost function value refers to the greatest cost function value. In some embodiments, operations 222, 224, and 226 are performed repetitively until routes for conductive paths of the integrated circuit are determined.

In some embodiments, the calculation of cost function values is based on a first cost function that put the process bias into consideration. Therefore, the corresponding cost function value is adjusted based on whether the corresponding route is at least partially assigned to be formed in the conductive layer by the first patterning process or the second patterning process.

For example, for a conductive path, such a timing-sensitive conductive path that would affect a suitable operational speed of the resulting integrated circuit, operation 224 further includes (a) increasing the corresponding cost function value when a delay caused by the corresponding route is resistance-dominated and the corresponding route is at least partially assigned to be formed in the conductive layer by the first patterning process; and (b) increasing the corresponding cost function value when the delay caused by the corresponding route is capacitance-dominated and the corresponding route is at least partially assigned. In some embodiments, the delay caused by the corresponding route is determining to be resistance-dominated when a length of the corresponding route is greater than a first predetermined threshold length. In some embodiments, the delay caused by the corresponding route is determined to be capacitance-dominated when the length of the corresponding route is less than a second predetermined threshold length.

In the example for operation 224, the first patterning process refers to the patterning process that has resulting conductive lines with less unit resistance and greater unit capacitance than those fabricated based on the second patterning process. As depicted in FIG. 1D, in some embodiments, the first patterning process includes patterning the first set of conductive lines 132a and 132b of structure 100D based on a mask 100A. The second patterning process includes forming a set of spacers 136a and 136b surrounding the first set of conductive lines and patterning the second set of conductive lines 134 of structure 100D within the gap of the set of spacers. As depicted in FIG. 1C, in some embodiments, the second patterning process includes patterning the second set of conductive lines 122a and 122b of structure 100C based on a mask 100A. The first patterning process includes forming a set of spacers 126a and 126b surrounding the second set of conductive lines 124 of structure 100C and patterning the first set of conductive lines 122a and 122b within the gap of the set of spacers.

In some embodiments, the calculation of cost function values is based on a second cost function that ignores the process bias. For example, for another conductive path that is less timing-sensitive than the conductive path on which the first cost function applies, another route is generated based on calculating cost function values using the second cost function. The second cost function is independent from whether the another route is at least partially assigned to be formed in the conductive layer by the first patterning process or the second patterning process. In some embodiments, all routes are determined based on process-bias aware cost function, and thus the application of the second cost function is omitted.

As depicted in FIG. 2, after routing conductive paths, in operation 230, a parasitic extraction operation is performed. During operation 230, parasitic resistance and capacitance of electric devices and conductive lines of the integrated circuit placed and determined during operations 210 and 220 are extracted based on a test file of the fabrication process.

In operation 240, a timing analysis is performed on the selected routes and electric devices of the integrated circuit based on the extracted parasitic capacitance and parasitic resistance from operation 230. The selected routes include at least one route that have at least a segment assigned to be formed in the conductive layer by either the first patterning process or the second patterning process as illustrated in conjunction with operations 222-226.

In operation 250, results of the timing analysis from operation 240 is compared with a set of predetermined timing requirements in order to determine if the placed electrical devices and the selected routes from operations 210 and 220 meet the set of predetermined timing requirements. If the placed electrical devices and the selected routes of the integrated circuit pass the timing analysis, the placement and routing results are output in operation 260. In some embodiments, the output of the placement and routing results (such as place-and-route output file 314c in FIG. 3) is stored in a non-transitory storage device (such as storage medium 314 in FIG. 3) in a database file format, e.g., GRAPHIC DATA SYSTEM (GDS II), OPEN ARTWORK SYSTEM INTERCHANGE STANDARD (OASIS), or other suitable formats.

On the other hand, if the placed electrical devices and the selected routes of the integrated circuit fail the timing analysis, the EDA tool or a circuit engineer would issue one or more engineering change order (ECO) in operation 270 to modify the circuit design, the driving capability of selected or placed electrical devices, the selected routes. In some embodiments, the ECO further includes reassigning the segment of the selected one of the one or more routes to be formed by the other one of the first patterning process and the second patterning process. In some embodiments, because there are neighboring conductive lines adjacent to the segment of the selected one of the one or more routes that cannot be formed using the same mask, the neighboring conductive lines will be reassigned to be formed by a different patterning process as well.

After operation 270, depending on whether the changes ordered by the ECOs would alter the result of operation 210, 220, or 230, the process moves back to operation 210, 220, or 230 in order to implement the ECOs and then re-execute the timing analysis (operation 240) for verification.

Figure 3:
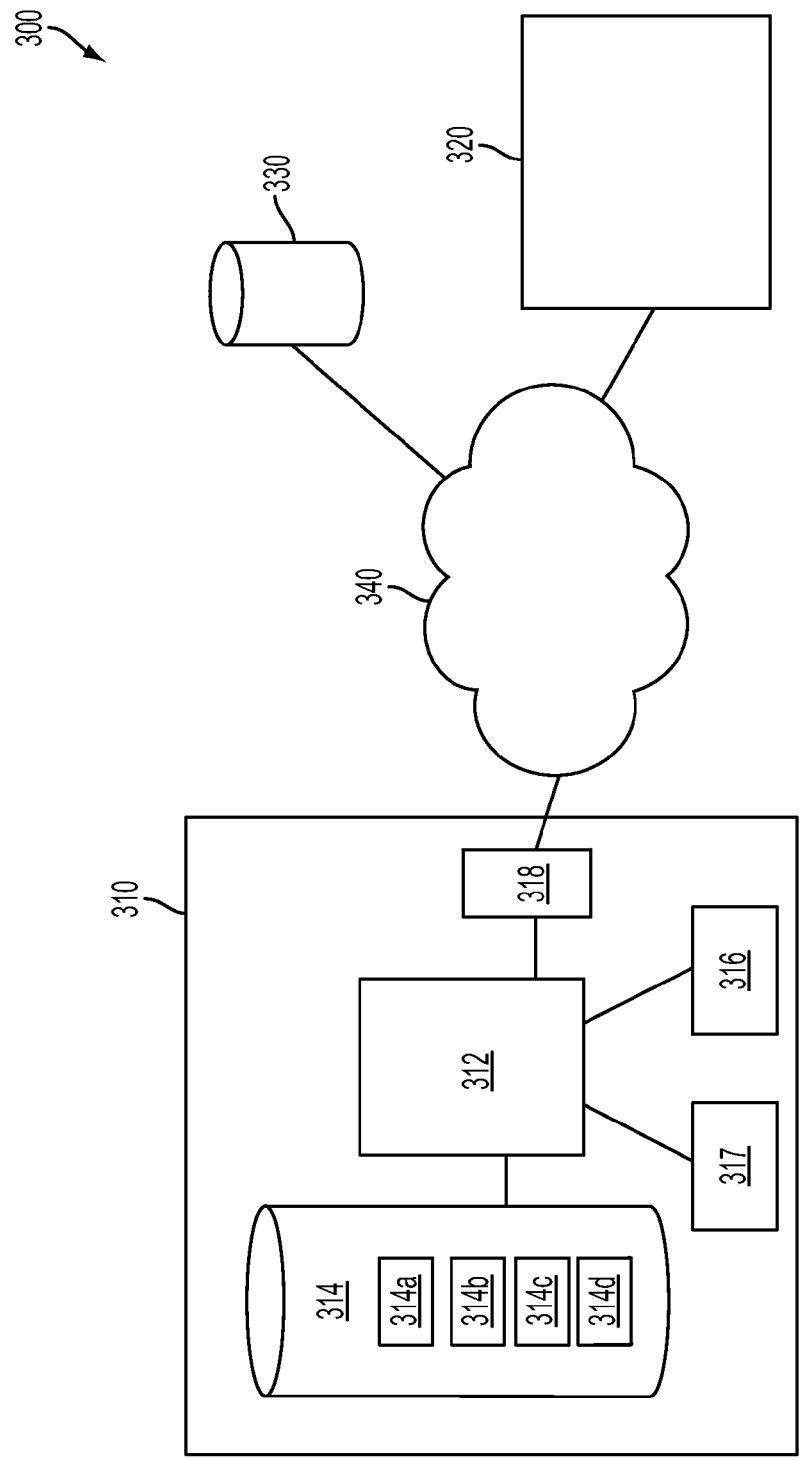
FIG. 3 is a functional block diagram of an integrated circuit designing system in accordance with one or more embodiments.

FIG. 3 is a functional block diagram of an integrated circuit designing system 300 in accordance with one or more embodiments. Integrated circuit designing system 300 includes a first computer system 310, a second computer system 320, a networked storage device 330, and a network 340 connecting the first computer system 310, the second computer system 320, and the networked storage device 330. In some embodiments, one or more of the second computer system 320, the storage device 330, and the network 340 are omitted.

The first computer system 310 includes a hardware processor 312 communicatively coupled with a non-transitory, computer readable storage medium 314 encoded with, i.e., storing, a circuit design 314a, a cell library 314b, a place-and-route output file 314c, and/or a computer program code 314d, i.e., a set of executable instructions. The processor 312 is electrically and communicatively coupled with the computer readable storage medium 314. The processor 312 is configured to execute a set of instructions 314d encoded in the computer readable storage medium 314 in order to cause the computer 310 to be usable as a placing and routing tool for performing a process as described in conjunction with FIG. 2.

In some embodiments, one or more of the circuit design 314a, the cell library 314b, the place-and-route output file 314c, and/or the computer program code 314d are stored in a non-transitory storage medium other than storage medium 314. In some embodiments, some or all of the circuit design 314a, the cell library 314b, and the place-and-route output file 314c are stored in a non-transitory storage medium in networked storage device 330 or second computer system 320. In such case, some or all of the circuit design 314a, the cell library 314b, and the place-and-route output file 314c stored outside computer 310 is accessible by the processor 312 through the network 340.

In some embodiments, the processor 312 is a central processing unit (CPU), a multi-processor, a distributed processing system, an application specific integrated circuit (ASIC), and/or a suitable processing unit.

In some embodiments, the computer readable storage medium 314 is an electronic, magnetic, optical, electromagnetic, infrared, and/or a semiconductor system (or apparatus or device). For example, the computer readable storage medium 314 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 314 includes a compact disk-read only memory (CD-ROM), a compact disk-read/write (CD-R/W), and/or a digital video disc (DVD).

The computer system 310 includes, in at least some embodiments, an input/output interface 316 and a display unit 317. The input/output interface 316 is coupled to the controller 312 and allows the circuit designer to manipulate the first computer system 310. In at least some embodiments, the display unit 317 displays the status of executing the set of instructions 314d in a real-time manner and preferably provides a Graphical User Interface (GUI). In at least some embodiments, the input/output interface 316 and the display 317 allow an operator to operate the computer system 310 in an interactive manner.

In at least some embodiments, the computer system 300 also includes a network interface 318 coupled to the processor 312. The network interface 318 allows the computer system 310 to communicate with the network 340, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a method includes generating one or more routes usable for implementing a conductive path of an integrated circuit. A corresponding cost function value for the one or more routes is calculated according to a first cost function, including adjusting the corresponding cost function value based on whether the corresponding route is at least partially assigned to be formed in a conductive layer by a first patterning process or a second patterning process. The integrated circuit has electrical devices and the conductive layer, and the conductive layer has a first set of conductive lines formed by the first patterning process and a second set of conductive lines formed by the second patterning process. The first set of conductive lines has a unit resistance less than that of the second set of conductive lines. The conductive path electrically connects two of the electrical devices of the integrated circuit.

In accordance with another embodiment, an integrated circuit designing system includes a non-transitory storage medium encoded with a set of instructions and a hardware processor communicatively coupled with the non-transitory storage medium. The hardware processor is configured to execute the set of instructions to generate one or more routes usable for implementing a conductive path of an integrated circuit and to calculate, according to a first cost function, a corresponding cost function value for the one or more routes. The calculation of the cost function value includes causing the hardware processor to adjust the corresponding cost function value based on whether the corresponding route is at least partially assigned to be formed in a conductive layer by a first patterning process or a second patterning process. The integrated circuit has electrical devices and the conductive layer, and the conductive layer has a first set of conductive lines formed by the first patterning process and a second set of conductive lines formed by the second patterning process. The first set of conductive lines has a unit resistance less than that of the second set of conductive lines. The conductive path electrically connects two of the electrical devices of the integrated circuit.

In accordance with another embodiment, a non-transitory storage medium is encoded with a set of instructions, and the set of instructions is configured to cause a hardware processor to perform a method including generating one or more routes usable for implementing a conductive path of an integrated circuit and calculating a corresponding cost function value for the one or more routes according to a first cost function. The calculating of the cost function value includes adjusting the corresponding cost function value based on whether the corresponding route is at least partially assigned to be formed in a conductive layer by a first patterning process or a second patterning process. The integrated circuit has electrical devices and the conductive layer, and the conductive layer has a first set of conductive lines formed by the first patterning process and a second set of conductive lines formed by the second patterning process. The first set of conductive lines has a unit resistance less than that of the second set of conductive lines. The conductive path electrically connects two of the electrical devices of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    generating one or more routes corresponding to a conductive path of an integrated circuit, the integrated circuit comprising electrical devices and a conductive layer, the conductive layer comprising a first set of conductive lines formed by a first patterning process and a second set of conductive lines formed by a second patterning process, the first set of conductive lines having a unit resistance less than that of the second set of conductive lines, and the conductive path electrically connecting two of the electrical devices of the integrated circuit;
    calculating, by a hardware computer according to a first cost function, one or more cost function values for the one or more routes, the calculating according to the first cost function comprising adjusting a corresponding cost function value of the one or more cost function values based on whether a corresponding route is at least partially assigned to be formed in the conductive layer by the first patterning process or the second patterning process, the adjusting the corresponding cost function value comprising:

adjusting the corresponding cost function value when a delay caused by the corresponding route is resistance-dominated and the corresponding route is at least partially assigned to be formed in the conductive layer by the first patterning process; and adjusting the corresponding cost function value when the delay caused by the corresponding route is capacitance-dominated and the corresponding route is at least partially assigned to be formed in the conductive layer by the second patterning process; and selecting one of the one or more routes, based on the one or more cost function values, the selected one of the one or more routes is configured to implement the conductive path.

2. The method of claim 1, wherein
the adjusting the corresponding cost function value when the delay caused by the corresponding route is resistance-dominated and the corresponding route is at least partially assigned to be formed in the conductive layer by the first patterning process comprises increasing the corresponding costs function value; and
the adjusting the corresponding cost function value when the delay caused by the corresponding route is capacitance-dominated and the corresponding route is at least partially assigned to be formed in the conductive layer by the second patterning process comprises increasing the corresponding costs function value.

3. The method of claim 1, further comprising:
determining the delay caused by the corresponding route is resistance-dominated when a length of the corresponding route is greater than a first predetermined threshold length; and
determining the delay caused by the corresponding route is capacitance-dominated when the length of the corresponding route is less than a second predetermined threshold length.

4. The method of claim 1, further comprising:
generating another route, according to a second cost function, corresponding to another conductive path of the integrated circuit, the another conductive path being less timing-sensitive than the conductive path, and the second cost function is independent from whether the another route is at least partially assigned to be formed in the conductive layer by the first patterning process or the second patterning process.

5. The method of claim 1, wherein
the selecting one of the one or more routes further comprises selecting the route having a greatest cost function value among the one or more routes.

6. The method of claim 1, further comprising:
performing a timing analysis on the selected one of the one or more routes, the selected one of the one or more routes having a segment assigned to be formed in the conductive layer by either the first patterning process or the second patterning process; and
reassigning the segment of the selected one of the one or more routes to be formed by the other one of the first patterning process and the second patterning process when a result of the timing analysis fails a predetermined timing requirement.

7. The method of claim 6, further comprising:
performing another timing analysis on the selected one of the one or more routes after the reassigning the segment of the selected one of the one or more routes.

8. The method of claim 1, further comprising:
performing placement of electrical devices, including the two electrical devices electrically connected by the conductive path, of the integrated circuit according to a circuit design of the integrated circuit.

9. An integrated circuit designing system, comprising:
a non-transitory storage medium encoded with a set of instructions;
a hardware processor communicatively coupled with the non-transitory storage medium and configured to execute the set of instructions to:

generate one or more routes corresponding to a conductive path of an integrated circuit, the integrated circuit comprising electrical devices and a conductive layer, the conductive layer comprising a first set of conductive lines formed by a first patterning process and a second set of conductive lines formed by a second patterning process, the first set of conductive lines having a unit resistance less than that of the second set of conductive lines, and the conductive path electrically connecting two of the electrical devices of the integrated circuit;

calculate, according to a first cost function, one or more corresponding cost function values for the one or more routes, comprising causing the hardware processor to adjust a corresponding cost function value of the one or more cost function values based on whether a corresponding route is at least partially assigned to be formed in the conductive layer by the first patterning process or the second patterning process, the adjusting the corresponding cost function value comprising:

adjusting the corresponding cost function value when a delay caused by the corresponding route is resistance-dominated and the corresponding route is at least partially assigned to be formed in the conductive layer by the first patterning process; and adjusting the corresponding cost function value when the delay caused by the corresponding route is capacitance-dominated and the corresponding route is at least partially assigned to be formed in the conductive layer by the second patterning process; and selecting one of the one or more routes, based on the one or more cost function values, the selected one of the one or more routes is configured to implement the conductive path.

10. The integrated circuit designing system of claim 9, wherein:
the adjusting the corresponding cost function value when the delay caused by the corresponding route is resistance-dominated and the corresponding route is at least partially assigned to be formed in the conductive layer by the first patterning process comprises increasing the corresponding cost function value; and
the adjusting the corresponding cost function value when the delay caused by the corresponding route is capacitance-dominated and the corresponding route is at least partially assigned to be formed in the conductive layer by the second patterning process comprises increasing the corresponding cost function value.

11. The integrated circuit designing system of claim 9, wherein the hardware processor, when executing the set of instructions, is further configured to:
- determine the delay caused by the corresponding route is resistance-dominated when a length of the corresponding route is greater than a first predetermined threshold length; and
- determine the delay caused by the corresponding route is capacitance-dominated when the length of the corresponding route is less than a second predetermined threshold length.

12. The integrated circuit designing system of claim 9, wherein the hardware processor, when executing the set of instructions, is further configured to:
- generate another route, according to a second cost function, corresponding to another conductive path of the integrated circuit, the another conductive path being less timing-sensitive than the conductive path, and the second cost function is independent from whether the another route is at least partially assigned to be formed in the conductive layer by the first patterning process or the second patterning process.

13. The integrated circuit designing system of claim 9, wherein
- the selecting one of the one or more routes further comprises selecting the route having a greatest cost function value among the one or more routes.

14. The integrated circuit designing system of claim 13, wherein the hardware processor, when executing the set of instructions, is further configured to:
- perform a timing analysis on the selected one of the one or more routes, the selected one of the one or more routes having a segment assigned to be formed in the conductive layer by either the first patterning process or the second patterning process; and
- reassign the segment of the selected one of the one or more routes to be formed by the other one of the first patterning process and the second patterning process when a result of the timing analysis fails a predetermined timing requirement.

15. The integrated circuit designing system of claim 14, wherein the hardware processor, when executing the set of instructions, is further configured to:
- perform another timing analysis on the selected one of the one or more routes after the reassigning the segment of the selected one of the one or more routes.

16. A non-transitory storage medium encoded with a set of instructions, the set of instructions is configured to cause a hardware processor to perform a method comprising:
- generating one or more routes corresponding to a conductive path of an integrated circuit, the integrated circuit comprising electrical devices and a conductive layer, the conductive layer comprising a first set of conductive lines formed by a first patterning process and a second set of conductive lines formed by a second patterning process, the first set of conductive lines having a unit resistance less than that of the second set of conductive lines, and the conductive path electrically connecting two of the electrical devices of the integrated circuit;
- calculating, by a hardware computer according to a first cost function, one or more corresponding cost function values for the one or more routes, the calculating according to the first cost function comprising adjusting a corresponding cost function value of the one or more cost function values based on whether a corresponding route is at least partially assigned to be formed in the conductive layer by the first patterning process or the second patterning process the adjusting the corresponding cost function value comprising:
  - adjusting the corresponding cost function value when a delay caused by the corresponding route is resistance-dominated and the corresponding route is at least partially assigned to be formed in the conductive layer by the first patterning process; and
  - adjusting the corresponding cost function value when the delay caused by the corresponding route is capacitance-dominated and the corresponding route is at least partially assigned to be formed in the conductive layer by the second patterning process; and
- selecting one of the one or more routes, based on the cost function values, the selected one of the one or more routes is configured to implement the conductive path.

17. The non-transitory storage medium of claim 16, wherein:
- the adjusting the corresponding cost function value when the delay caused by the corresponding route is resistance-dominated and the corresponding route is at least partially assigned to be formed in the conductive layer by the first patterning process comprises increasing the corresponding cost function value; and
- the adjusting the corresponding cost function value when the delay caused by the corresponding route is capacitance-dominated and the corresponding route is at least partially assigned to be formed in the conductive layer by the second patterning process comprises increasing the corresponding cost function value.

18. The non-transitory storage medium of claim 16, wherein the set of instructions are configured to cause the hardware processor to perform the method further comprising:
- determining the delay caused by the corresponding route is resistance-dominated when a length of the corresponding route is greater than a first predetermined threshold length; and
- determining the delay caused by the corresponding route is capacitance-dominated when the length of the corresponding route is less than a second predetermined threshold length.

19. The non-transitory storage medium of claim 16, wherein the set of instructions are configured to cause the hardware processor to perform the method further comprising:
- generating another route, according to a second cost function, corresponding to another conductive path of the integrated circuit, the another conductive path being less timing-sensitive than the conductive path, and the second cost function is independent from whether the another route is at least partially assigned to be formed in the conductive layer by the first patterning process or the second patterning process.

20. The non-transitory storage medium of claim 16, wherein
- the selecting one of the one or more routes further comprises selecting the route having a greatest cost function value among the one or more routes.

21. The non-transitory storage medium of claim 20, wherein the set of instructions are configured to cause the hardware processor to perform the method further comprising:
- performing a timing analysis on the selected one of the one or more routes, the selected one of the one or more routes having a segment assigned to be formed in the conductive layer by either the first patterning process or the second patterning process; and reassigning the segment of the selected one of the one or more routes to be formed by the other one of the first patterning process and the second patterning process when a result of the timing analysis fails a predetermined timing requirement.

\* \* \* \* \*